Oct. 21, 1969 J. NAGY, JR 3,474,258
SOLID STATE RELAYS
Filed March 3, 1967 2 Sheets-Sheet 1

INVENTOR.
John Nagy, Jr.
BY
J M Tresson
ATTORNEY

United States Patent Office 3,474,258
Patented Oct. 21, 1969

3,474,258
SOLID STATE RELAYS

John Nagy, Jr., Union, N.J., assignor to Weston Instruments, Inc., Newark, N.J., a corporation of Delaware Continuation-in-part of application Ser. No. 579,104, Sept. 13, 1966. This application Mar. 3, 1967, Ser. No. 620,304
Int. Cl. H03k 17/28, 17/16
U.S. Cl. 307—235 12 Claims

ABSTRACT OF THE DISCLOSURE

A solid state relay is provided for connecting a load to a source of load power in response to a variable amplitude input signal which is applied to the relay to control the operation thereof. The relay includes a bridge comparison circuit having a leg which sums the voltage differences between the input signal and a corresponding set point or reference signal. A pair of terminals which define the vertices of this leg are connected to different emitter electrodes of a transistor differential amplifier stage having a common base configuration and forming a first stage of a plural stage differential amplifier, the first stage being highly sensitive to voltage unbalances. When the amplitude of the input signal exceeds the amplitude of the corresponding reference signal, a reversal of voltage polarity occurs between the vertices. A reverse in voltage polarity is detected and amplified by the differential amplifier and is transmitted to a switching device to change the state of that device. The switching device may be selectively connected to either of two output terminals of the differential amplifier, and thus may be turned on when the input signal is either greater than or less than the corresponding reference signal. When the device turns on it energizes an oscillator circuit the output from which provides a gating signal to a controlled rectifier. The controlled rectifier is thereby rendered conductive and completes a circuit between the load and the source of load power.

This invention relates to solid state relay apparatus and, more specifically, to a solid state relay for supplying power to a load in response to an input signal of a given amplitude. This application is a continuation-in-part of my U.S. application Ser. No. 579,104, filed Sept. 13, 1966, entitled "Solid State Relay," now abandoned.

Solid state relays are used extensively to selectively connect a load to a source of load power. These relays are controlled by variable amplitude input signals which are derived from a conventional input voltage or current source. The input signal amplitude is compared to a corresponding reference or set point signal amplitude and the relay is caused to switch the connection to or from the load power source when the input signal amplitude exceeds the corresponding reference or set point signal amplitude.

Different commercial uses of the solid state relay impose different requirements on the relay. In general, the relay is required to be as sensitive as possible to the condition of the input signal amplitude exceeding the corresponding reference signal amplitude for obvious reasons. Another requirement that is often imposed on the relay is that it not appear as a source of voltage to the input signal source since in such instances any voltage which is fed back from the relay to the input signal source may generate spurious signals in the source. These spurious signals might, in turn, be fed back as spurious signals to the relay.

It is an object of this invention to provide a solid state relay which is connected to an input signal source for receiving an input signal therefrom and which does not appear as a source of spurious signals to the input signal source.

It is another object of this invention to provide a solid state relay which is highly sensitive to voltage unbalances resulting from a comparison of an input signal with a corresponding reference or set point signal.

A further object of this invention is to provide a solid state relay which may be readily and easily connected to provide one of two modes of load state for a given range of input signal amplitude.

According to this invention, a solid state relay is provided wherein a load is to be supplied with power by connection of the load to a power source when an input signal which is applied to the relay bears a predetermined amplitude relationship with the amplitude of a corresponding reference or set point signal. The input signal and a reference signal are applied to a resistance bridge and a plural stage differential amplifier has its first stage connected to a pair of terminals defining that one leg of the bridge which sums the voltage differences between the input signal and the corresponding reference signal which are applied as positive voltages to different ones of the leg terminals. The amplifier detects and amplifies reversals in voltage polarity between the pair of bridge leg terminals caused by the amplitude of the input signal exceeding the corresponding amplitude of the reference signal. When the amplifier detects a reversal in voltage polarity between the pair of bridge terminals it turns on a transistor switch. The switch can be selectively connected to either of two output terminals of the differential amplifier so that it can be turned on when the input signal is either greater than or less than the corresponding reference signal which is applied to said one bridge leg. When the switch turns on, it energizes an oscillator circuit the output from which provides a gating signal to a controlled rectifier. The controlled rectifier is thereby rendered conductive and completes a circuit which includes the load and a source of power.

For many applications, it is important that the solid state relay not appear as a source of spurious voltages to the input signal source. In addition, it is usually preferable that the relay have a high sensitivity to voltage reversals which reflect changes in polarity between the pair of terminals defining the voltage-difference summing leg of the comparison circuit. The relay of this invention fulfills both of these requirements through the utilization of a novel interface between the pair of terminals defining the voltage-difference summing leg of the bridge and the second stage of the differential amplifier.

In order that the manner in which the foregoing and other objects are attained in accordance with the invention can be understood in detail, one particularly advantageous embodiment thereof will be described with reference to the accompanying drawings, which form a part of this specification, and wherein.

Figure 1:
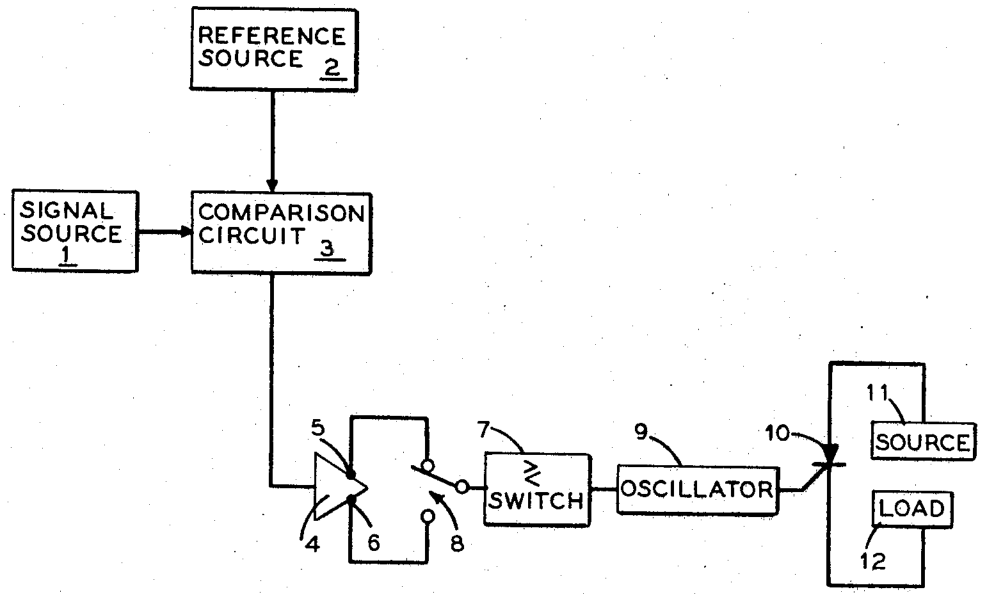
FIGURE 1 is a schematic diagram, partly in block form, of one embodiment of this invention.

In FIGURE 1, a signal source 1 and a reference source 2 both provide signals to the input terminals of a comparison circuit 3, circuit 3 being designed to supply a signal at its output terminal when the amplitude of the signal from source 1 differs from the corresponding set point or reference signal supplied by source 2. It will be obvious that sources 1 and 2 must provide signals of the same type, D.C. signals being contemplated in this case. The output of comparison circuit 3 is connected to a differential amplifier circuit 4 which is capable of providing voltage signals at output terminals 5 and 6, each voltage signal having one of two polarities. As mentioned briefly hereinabove, and as will be described in detail subsequently, a unique resistance interface is provided between the comparison circuit 3 and the differential amplifier 4 which permits isolation between the signal source 1 and the amplifier 4 and permits the amplifier 4 to operate with high sensitivity to voltage unbalance sensed by the comparison circuit 3. When the amplitude of the signal from the signal source 1 is greater than the corresponding signal from the reference source 2, a voltage unbalance occurs which causes the terminal 5 to receive the more positive voltage and when the signal from the signal source 1 is less than the corresponding signal from the reference source 2, a voltage unbalance occurs which causes the terminal 6 to receive the more positive voltage.

Output terminals 5 and 6 of amplifier 4 are alternatively connected to a switch 7 which can be characterized as a "greater than, less than" switch. The alternative connection is indicated by a single pole, double throw switch indicated generally at 8. Typically, the switch 8 will take the form of a single lead or conductive link, the associated terminals that are connected to the terminals 5 and 6 being mounted externally of the housing, not shown, that encases the relay circuitry and components so that facile selective connection may be made to either terminal 5 or 6. The switch 8 would be connected to the selected output terminal 5 or 6 or differential amplifier 4 which provides a more positive or a more negative voltage until the amplitude of the signal from the signal source 1 exceeds the amplitude of a compared corresponding signal derived from the reference source 2. The relay is designed so that when this occurs, the relative polarities of the voltage signals appearing on the terminals 5 and 6 reverse and cause a reversal in the polarity of the voltage which is applied to the switch 7.

Switch 7 responds to the more positive polarity of the voltage signal on the terminal to which it is connected by providing an activating signal to an oscillator circuit 9. The oscillator 9 is of a type which is in a nonoscillatory state except when it is provided with such a signal, at which time it changes state, oscillates and produces a pulse at its output terminal. The output terminal of oscillator 9 is connected to the gate electrode of a semiconductor switching device such as a controlled rectifier 10. The anode and cathode of controlled rectifier 10 are connected in series circuit relationship with a source of power 11 and a load device 12. As will be obvious to one skilled in the art, no current can flow between the source and the load unless controlled rectifier 10 is in a conductive state, this state being induced by the application of an output signal from oscillator 9 to the gate electrode of the controlled rectifier 10.

Figure 2:
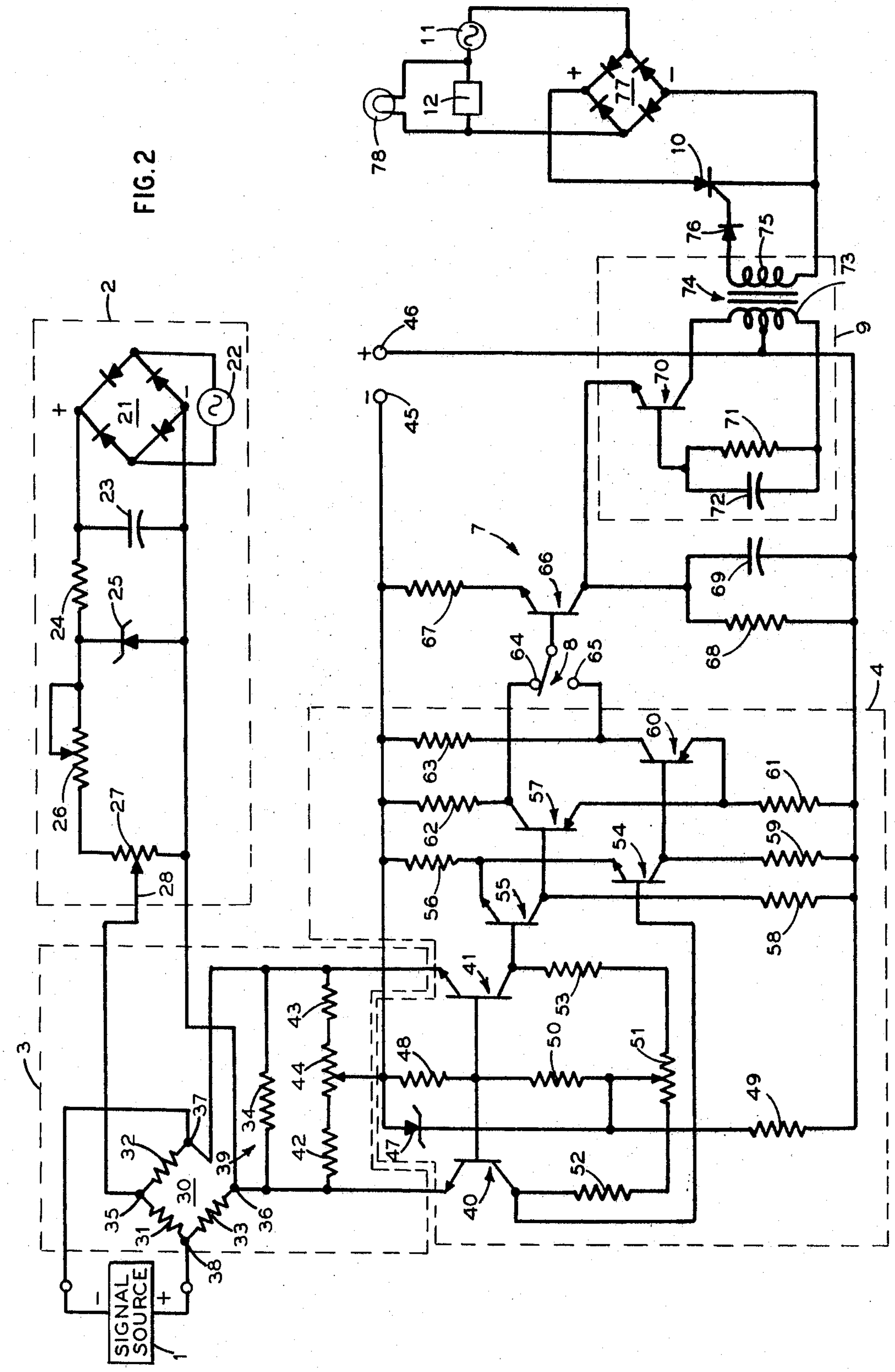
FIGURE 2 is a schematic diagram showing in greater detail the embodiment of FIGURE 1.

FIGURE 2 shows a somewhat more detailed schematic diagram of a system of the type shown in FIGURE 1, the same reference numerals being used for like elements.

Now describing these various elements in greater detail, it will be seen that the reference source 2 is a conventional source of controlled amplitude D.C. voltage including a bridge rectifier circuit 21, the input terminals of which are connected to a source of alternating current power 22. A filter capacitor 23 is connected between the output terminals of bridge rectifier 21, and one terminal of a resistor 24 is connected to the positive output terminal. A Zener diode 25 is connected across the output conductors from bridge circuit 21, the cathode of diode 25 being connected to the other terminal of resistor 24 and to one end of a variable resistance 26 which is also in series with the positive output conductor. The fixed end terminals of a potentiometer 27 are connected to the positive and negative D.C. conductors from bridge circuit 21, one fixed terminal being connected to the other end of variable resistor 26, and the other end being connected directly to the negative output terminal of bridge circuit 21. A movable wiper 28 of potentiometer 27 is connected to one input terminal 35 of comparison circuit 3, potentiometer 27 acting as a voltage divider by which the voltage or current reference level from reference source 2 can be adjusted.

Comparison circuit 3 includes a resistance bridge 30 the four legs of which are resistors 31, 32, 33 and 34, the resistors 31 and 32 having equal values of resistance and the resistors 33 and 34 having considerably lesser values of resistance, but not necessarily equal values of resistance. The voltage derived from the set point or reference voltage source is typically orders of magnitude higher than the voltage derived from the signal source 1. Thus, to provide equal magnitudes of current flow between the terminals 36 and 37, the resistance of the resistors 31 and 32 must be proportionately greater than the resistance of resistor 33. This relationship between the resistors 31 and 32 and the resistor 33 is fortuitous because the resistors 31 and 32 present a very high impedance to current flow from the signal source 1, and thus the current shunting effect of the resistors 31 and 32 has only a very slight effect on reducing the sensitivity of the comparator 30 and the amplifier 4. The movable wiper 28 of potentiometer 27 is connected to vertex terminal 35 of bridge 30 and the negative output terminal of reference source 2 is connected to a vertex terminal 36 of bridge 30. The negative and positive output terminals of signal source 1 are connected to vertex terminals 37 and 38, respectively.

The leg of bridge 30 including resistor 34 serves as the output leg of the comparison circuit 3, is designated generally by the numeral 39 and, for reasons which will be evident subsequently, provides a matched, low impedance interface between the bridge 30 and the differential amplifier 4. As will be apparent to one skilled in the art, if the currents which flow between terminals 36 and 37 are of equal magnitude, by virtue of their opposite directions of flow, no voltage drop will appear across the terminals 36 and 37 and no current will flow through the resistor 34. This condition might be termed one of "null current flow" between the terminals 36 and 37. However, if the input voltages now change so that a net current flows between terminals 36 and 37, a voltage will be developed across resistor 34, this voltage being of one polarity if the signal voltage increases from the previous null current flow condition, and of the opposite polarity if the input voltage is decreased from that voltage required to provide the null current condition. The two ends of resistor 34 and connected to the emitter electrodes of an NPN transistor indicated generally at 40 and an NPN transistor indicated generally at 41, respectively. Transistors 40 and 41 respond to the presence and polarity of a voltage signal developed across resistor 34 as a result of a difference in amplitude between the reference and input signal voltages.

A voltage divider including fixed resistors 42 and 43 and the fixed terminals of a potentiometer 44 is connected in parallel with resistor 34 between the emitters of transistors 40 and 41. The movable wiper of potentiometer 44 is connected to a negative terminal 45 of a source of D.C. voltage which is provided to energize the transistors of differential amplifier 4 and oscillator 9. The wiper of potentiometer 44 is also connected to the anode of a Zener diode 47 and to one terminal of a resistance 48. The other terminal of resistance 48 is connected to the base electrodes of both of transistors 40 and 41. The cathode of Zener diode 47 is connected via a fixed resistance 49 to the positive terminal 46 of the D.C. source of supply voltage. The cathode of diode 47 is also connected to one terminal of a fixed resistor 50, the other terminal of which is connected to the base electrodes of transistors 40 and 41, and to the movable wiper of a potentiometer 51. Potentiometer 51 is part of a voltage divider, the end terminals of the potentiometer being connected to fixed resistors 52 and 53, respectively, the other terminals of those resistors being connected to the collector electrodes of transistors 40 and 41.

Referring again to the interface between the transistors 40 and 41 and the bridge 30, the resistance which appears between the terminals 36 and 37, is the effective resistance of the leg 39, this resistance being equal to the equivalent resistance of three parallel resistance branches. The first branch is formed by the resistor 34, the second by the series resistances 42, 43 and 44, and the third branch comprises the emitter resistance of the transistor 40 in series with the emitter resistance of the transistor 41. For many applications it is important that the transistors 40 and 41 not appear as a voltage source to the bridge 30 and to the signal source 1. For example, if the signal source 1 is a thermocouple and if it were supplied current from the bridge 30, it would generate additional heat and in turn produce a spurious output voltage back to the bridge. For this reason, the resistance of the bridge leg 39 is made practically equal to the resistance of the bridge leg 33; the resistors 42 and 43 being selected to have equal but relatively high resistance values so that being in parallel with the resistor 34 and the series emitter resistance offered by the transistors 40 and 41, the resistors 42 and 43 appear as having a negligible effect on the total parallel resistance value of the aforementioned three resistance branches. Further, by virtue of the common base configuration of the transistors 40 and 41, a low impedance is provided between the emitter terminals of these transistors which closely approaches the low impedance offered by the resistor 33. An additional advantage of using a common base configuration for the transistors 40 and 41 is that when a voltage unbalance occurs across the emitter terminals of the transistors 40 and 41 more current flows into the transistors 40 and 41 than through the resistor 34. Thus, more of the voltage unbalance signal is utilized to drive the first differential amplifier stage and, hence, a high sensitivity to voltage unbalance is provided in the first differential amplifier stages. Although the common base configuration provides a current gain which is less than unity, on the other hand, it provides large voltage gains for amplifying the voltage unbalance which is detected by the first stage in the second and third amplifying stages.

The collector electrode of transistor 40 is also connected to the base electrode of an NPN transistor indicated generally at 54, and the collector electrode of transistor 41 is connected to the base electrode of an NPN transistor indicated generally at 55. The emitter electrode of transistor 55 is connected to the emitter electrode of transistor 54 and also to one terminal of a fixed resistor 56, the other terminal of which is connected to the negative D.C. line. The collector electrode of transistor 55 is connected to the base electrode of a PNP transistor indicated generally at 57, and also via a fixed resistor 58 to the positive D.C. line. The collector electrode of transistor 54 is connected via a fixed resistor 59 to the positive terminal of the D.C. source, and also to the base electrode of a PNP transistor indicated generally at 60. The emitter electrodes of transistors 57 and 60 are connected together and to one end of a fixed resistor 61, the other terminal of which is connected to the positive terminal of the D.C. source. The collector electrode of transistor 57 is connected via a resistor 62 to the negative terminal of the D.C. source line, and the collector electrode of transistor 60 is connected via a resistor 63 to the negative terminal of the D.C. source. The collector electrodes of transistors 57 and 60 are also connected to fixed contacts 64 and 65 of single pole, double throw switch 8, the movable contact of which is connected to the base electrode of an NPN transistor indicated generally at 66. The emitter electrode of transistor 66 is connected to one terminal of a biasing resistor 67, the other terminal of which is connected to the negative terminal of the D.C. source. The collector electrode of transistor 66 is connected to one end of a parallel circuit including a fixed resistor 68 and a capacitor 69, the other ends of these elements being connected to the positive terminal of the D.C. source. The capacitor 69 serves as an A.C. bypass and the resistor 68 serves as a current bleed for the capacitor 69. The collector electrode of transistor 66 is also connected to the emitter electrode of an NPN transistor indicated generally at 70, transistor 70 being the active element in oscillator circuit 9. Whereas the transistor 66 is operated as a switch the three stage differential amplifier 20 is operated as a class A amplifier, that is, the transistors 40, 41, 54, 55, 57 and 60 are operated throughout the linear region of their voltage-current characteristic curves. The base electrode of transistor 70 is connected to one terminal of a parallel circuit including a fixed resistor 71 and a capacitor 72, the other terminal of this parallel circuit being connected to the terminal at one end of the center tapped primary winding 73 of a transformer indicated generally at 74. The terminal at the other end of winding 73 is connected to the collector of transistor 70. The center terminal of winding 73 is connected to positive D.C. terminal 46.

One end terminal of secondary winding 75 of transformer 74 is connected to the anode of a semiconductor diode 76, the cathode of which is connected to the gate electrode of controlled rectifier 10. The other end terminal of winding 75 is connected to the cathode of controlled rectifier 10 and also to the negative D.C. terminal of a bridge rectifier circuit 77 which has four asymmetrically conductive legs. The positive D.C. terminal of bridge circuit 77 is connected to the anode of controlled rectifier 10. The A.C. terminals of rectifier circuit 77 are connected to the series circuit of power source 11, an indicator lamp 78 and load device 12. Lamp 78 is inserted to provide a visible indication of load energization.

Before the relay can be operated by a single source of variable amplitude voltage or current, it is necessary to calibrate the relay set point control or reference source for two extreme settings; the zero and full scale settings. The zeroing setting involves disconnecting the source 1 from the terminals 37 and 38 and connecting a conventional voltmeter across the terminals 36 and 37. The wiper arm 28 is then moved down the resistor 27 until it makes contact with the negative voltage line providing the reference ground of the set point signal or reference source. The resistor 44 is then adjusted until the voltmeter reads a null. Thus, the resistor 44 sets the base-to-emitter voltage of the transistors 40 and 41 so that both of these voltages are equal and, hence, equal voltages appear on the emitter terminals of the transistors 40 and 41. Under this condition, no current will flow into the bridge 30 from the differential amplifier 4. After the null appears on the emitter terminals of the transistors 40 and 41, the voltmeter is removed.

The adjustment of the resistor 44 simultaneously provides the largest degree of temperature compensation for the transistors 40 and 41. If additional temperature compensation is desired, a resistor, not shown, may be connected across the base and emitter electrodes of either transistor 40 or 41 as required. The value of such a resistor may be readily calculated once the residual voltage drift of the transistor is known.

The adjustment of the resistor 44 to obtain a null emitter voltage and temperature compensation of the transistors 40 and 41 often produces a current unbalance in the transistors 40 and 41. A current unbalance in the transistors 40 and 41 of the first stage will cause an unbalance in the second and third amplifying stages as well. To bring the collector voltages of the transistors forming the differential amplifier 4 into a slight voltage unbalance such that the blocking oscillator is just below the threshold voltage level needed to activate it, the resistor 51 is adjusted until the voltage which appears on the collector of the transistor 57 or 60 and, hence, on the terminal 64 or 65 to which the switch 8 is connected is just below the threshold activating level of the oscillator 9. This condition may be reached by adjusting the resistor 51 and simultaneously observing the state of the lamp 78, the resistor 51 being trimmed until the lamp 78 flickers off. The relay is now calibrated for a zero setting.

To calibrate the relay for full scale setting the wiper 28 is moved to its maximum voltage tap off position and a standard, current or a voltage source of known value is connected across the terminals 37 and 38. The current or voltage output of this source is made equal to the desired value of the set point current or voltage at the full scale setting. The resistor 26 is then trimmed until the lamp 78 flickers on. The source is then removed from the terminals 37 and 38, and the wiper arm 28 reset to a preselected set point position on the resistor 27 between zero and full scale setting.

After calibration, the signal source 1 is reconnected to the terminals 37 and 38 and the relay will remain in the zero set state until the current or voltage amplitude control signal exceeds the amplitude of the set point signal and causes a reversal in the direction of current flow between terminals 36 and 37.

The operation of the differential amplifier 4 can be explained by assuming an unbalance between the voltages supplied by sources 1 and 2 so that a net voltage is developed across resistor 34 which produces a difference in the voltages applied to the emitter electrodes of transistors 40 and 41. When the polarity of the voltage appearing across resistance 34 is such that the emitter of transistor 41 goes more positive than the emitter of transistor 40, transistor 41 becomes less conductive, reduces the voltage drop across resistor 53 and causes a more positive voltage to be applied to the base of NPN transistor 55. Transistor 55 is thereby rendered more conductive than transistor 54 and a more negative voltage is developed across resistor 58 and applied to the base of PNP transistor 57, rendering that transistor more conductive than the transistor 60. When the transistor 57 is rendered more conductive its collector voltage will go more positive and a more positive voltage appears on the terminal 64 than appears on the terminal 65. Thus, when the signal is as assumed with transistors 40, 55 and 57 rendered more conductive than the transistors 41, 54 and 60, a more positive voltage appears on the terminal 64 than appears on the terminal 65.

With switch 8 in the position shown in FIGURE 2, the more positive voltage which is applied to the base electrode of transistor 66 drives that transistor into saturation. Transistor 66 is connected to operate as a switch between the emitter electrode of transistor 70 and negative D.C. terminal 45. Thus, when transistor 66 is turned on, a circuit is completed from positive D.C. terminal 46 through one-half of primary winding 73 of transformer 74, through the collector-emitter circuit of transistor 70, through the collector-emitter circuit of transistor 66, which presents a low impedance in the conductive state, and through fixed resistor 67 to negative DC terminal 45. This energizes transistor 70 of oscillator 9 and causes that oscillator to provide a pulse at the gate of controlled rectifier 10.

The details of the operation of oscillator circuit 9 need not be discussed in great detail, this being a conventional single transistor blocking oscillator circuit with the reactive elements, capacitor 72 and the inductive primary winding 73 of transformer 74 providing the base-collector feedback necessary to generate oscillations. The oscillations generated are coupled through transformer 74 and are provided as positive unidirectional signals at the gate electrode of controlled rectifier 10 by the rectifying action of diode 76. The positive gate signals place controlled rectifier 10 in a conductive state in a manner well known to those skilled in the art, thereby completing a circuit between the positive and negative D.C. terminals of bridge rectifier 77 and allowing current to flow between the A.C. terminals of the bridge rectifier. Current is thereby allowed to flow through the circuit including power source 11, the bridge rectifier and load device 12.

It will be obvious that as the voltage generated by signal source 1 continues to increase until it reaches a level which will cause the polarity of the voltage appearing across resistor 34 to reverse, the emitter of transistor 40 will then go more positive than the emitter of transistor 41. In this case, the transistor 40 will become less conductive and the more positive voltage will appear at terminal 65 of switch 8, but will be of no effect unless the base electrode of transistor 66 is connected to the terminal 65 by the switch 8. Since the switch 8 may be readily and easily connected to either terminal 64 or 65, the desired response of the load 12 to a signal from the source 1 having a certain known amplitude range may be facilely set or changed. In a commercial embodiment of the apparatus, the switch 8 might be replaced by a simple link insertable between a selected two of three screws that are mounted externally of the housing that encases the circuitry of the relay, said two screws corresponding to the contacts 64 and 65.

To this point, it has been assumed that the apparatus is designed and the values selected for response to input signals in a particular current or voltage range, for example, 0 to 100 microamperes. It is possible, however, to provide precalibrated series or shunt resistors which can be added to the circuit, and to also provide means for easily connecting these resistors into the circuit, to render the apparatus usable in other ranges with no loss of accuracy.

Figure 3:
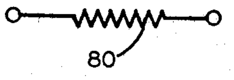
FIGURES 3 and 4 are schematic diagrams of representative range changing circuits usable in the embodiment of FIGURE 2.

FIGURE 3 shows a resistor 80 which can be substituted for the conductor portion between the positive terminal of signal source 1 and vertex terminal 38 of bridge 30 to change the signal voltage range from microvolts to millivolts or volts, the value of resistor 80 being previously appropriately selected in a manner which will be obvious to one skilled in the art.

Figure 4:
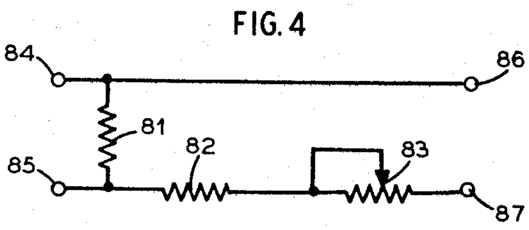

FIGURE 4 shows a shunt circuit including a shunt resistor 81, a series fixed resistor 82 and a series variable resistor 83; resistor 81 being connected between terminals 84 (or 86) and 85 and resistors 82 and 83 being connected in series circuit relationship between terminals 85 and 87. The circuit of FIGURE 4 is illustrative of the type of circuit which can be placed in the circuit of FIGURE 2 to change current ranges from, for example, microamperes to milliamperes or amperes. Terminals 84 and 85 are connectable to the negative and positive output terminals of input signal source 1, respectively, and terminals 86 and 87 are connectable to vertex terminals 37 and 38, respectively, of bridge 30. The existing conductors between these points would, of course, be removed.

While one advantageous embodiment has been chosen to illustrate the invention, it will be understood by those skilled in the art that various changes and modifications can be made therein without departing from the scope of the invention as defined in the appended claims.

What is claimed is:

1. A solid state relay comprising: a relay input terminal for receiving an electrical input signal, a source of reference voltage having an output terminal, comparison circuit means having a first input terminal connected to the output terminal of said source of reference voltage and a second input terminal connected to said relay input terminal, said comparison circuit means including an output impedance element having two terminals connected to the first and second input terminals so as to sum differences in amplitude between the voltage of that portion of the electrical input signal and of that portion of the reference source voltage which appears on different ones of the two terminals of said output impedance element, said impedance element producing output voltage signals having one of two polarities as determined by the relative amplitudes of both voltage portions, differential amplifier means having a pair of input terminals connected to different ones of the two terminals of said output impedance element means for detecting and amplifying reversals of polarity of the output voltage signals, said differential amplifier means including at least one output terminal, oscillator circuit means including an input terminal connected to the output terminal of said differential amplifier means to receive amplified voltage signals therefrom and further including an output terminal, said oscillator circuit means being driven by an energizing voltage signal of a predetermined one of two polarities to provide an oscillating signal at its output terminal; solid state switching means having a control terminal connected to the output terminal of said oscillator circuit means and two other terminals, said two other terminals of said switching means being respectively connected to a source of electrical power and to a load, the impedance of said switching means between said two other terminals being normally sufficiently high to prevent significant current flow from the source to the load, said switching means being responsive to an oscillating signal at said output terminal of said oscillator circuit means to radically decrease the impedance between said two other terminals and to allow current flow between the source and the load.

2. An apparatus according to claim 1 wherein said differential amplifier means includes two transistsors, said two transistors being connected in a common base configuration, the emitter electrode of each transistor being connected to different ones of the two terminals of said output impedance element.

3. An apparatus according to claim 2, wherein said differential amplifier means further comprising third and fourth transistors each having a control electrode and two other electrodes and being coupled together to provide a second differential amplifier stage, said control electrodes of said third and fourth transistors each being connected to the collector electrodes of said first and second transistors; means connecting one of said other electrodes of each of said third and fourth transistors to different ones of two electrical contacts and a transistor switching circuit including a fifth transistor having a control electrode and two other electrodes, said control electrodes of said transistor switching circuit being connected to the said output terminal of said differenial amplifier means, means selectively connecting said control electrode of said fifth transistor to one of said two contacts, said fifth transistor providing an energizing signal to said oscillator circuit means in response to a voltage signal from output impedance element of a predetermined polarity when (a) said control electrode of said fifth transistor is connected to one of said contacts and said voltage signal is of said predetermined polarity, or (b) said control electrode of said fifth transistor is connected to the other of said contacts and said voltage signal reverses its polarity from said predetermined polarity.

4. The relay as claimed in claim 1, wherein said comparison circuit means comprises, a bridge circuit having at least four legs and at least four vertices, said output impedance element comprising one of said legs including a resistor having two terminals connected to individual first and second of the four vertices, said first input terminal of said comparison circuit means being connected to a third vertex, and said second input terminal of said comparison circuit means being connected to the first vertex.

5. The relay as claimed in claim 1, wherein said amplifier means comprises at least one stage of amplification connected to said output impedance element of said comparison circuit means for detecting and amplifying reversals in the polarity of voltage signals produced by said impedance element; and switching circuit means connected to said at least one stage of amplification to receive the voltage signals therefrom and being responsive to a predetermined one of two voltage polarities for providing an energizing voltage signal at said input terminal of said oscillator circuit means.

6. The relay according to claim 1, wherein said source of reference voltage comprises a bridge rectifier circuit having two opposite vertices thereof connected to a source of alternating current; a Zener diode connected between the two other vertices of said bridge and including a cathode electrode; and resistance circuit means interconnecting the cathode electrode of said Zener diode and said first input terminal.

7. An apparatus according to claim 1, wherein said switching circuit means comprises a controlled rectifier gate, and a bridge rectifier having four asymmetrically conductive legs and four vertices, two of said vertices being connected to the anode and cathode electrodes of said controlled rectifier, the remaining vertices being connected to said load and said source of load power.

8. A solid state relay comprising an input signal source and a reference signal source, an impedance bridge including first and second opposed impedance legs joined at a first vertex, means connecting said reference signal source to said first vertex, said bridge also including third and fourth opposed legs, the third leg being joined at a second vertex to said first leg, means connecting the input signal source to said second vertex, the fourth leg of said bridge being joined to said second and third legs at respective third and fourth vertices, said fourth leg summing differences in voltages which are applied to said third and fourth vertices and the polarity of the voltage which appears across said fourth leg reversing as the input signal amplitude exceeds that portion of the reference signal which is applied to said third vertex, differential amplifying means including first and second transistors, each transistor having an emitter electrode, a base electrode and a collector electrode, the emitter electrode of the first transistor being connected to said fourth vertex and the emitter electrode of said second transistor being connected to said third vertex to receive voltages therefrom, the base electrodes of said transistors being connected in a common base configuration, an impedance connected between said third and fourth vertices and having a resistance value such that the resistance which appears between said third and fourth vertices is substantially equal to the resistance which appears between the second and fourth vertices, and means connected to the collector electrode of at least one of said transistors and responsive to a reversal of collector voltage polarity for selectively connecting a load to a source of load power.

9. The relay as claimed in claim 8 which further includes means coupled to both of said collector electrodes for applying a more positive potential to one of the collector electrodes.

10. The relay as claimed in claim 9 wherein said means coupled to both of said electrodes includes a variable resistor in series with both of said collector electrodes, and a voltage source connected to said variable resistor.

11. The relay as claimed in claim 8 which further includes a resistor connected in parallel with said impedance, and means coupling said resistor to the base electrodes of said transistors for providing a null voltage between the emitter terminals of said transistors.

12. The relay as claimed in claim 8 which further includes a switching device coupled between the collector electrodes of said transistors and said means for selectively connecting a load to a source of load power, and means for selectively connecting said switching device to different ones of said collector electrodes.

References Cited

UNITED STATES PATENTS 3,149,224 9/1964 Horne et al. -------- 219—497

JOHN S. HEYMAN, Primary Examiner

J. D. FREW, Assistant Examiner

U.S. Cl. X.R.

219—497, 499; 307—252, 255, 257; 328—146; 330—30